United States Patent

Pham et al.

[11] Patent Number: 5,906,497
[45] Date of Patent: May 25, 1999

[54] PROCESSOR RETENTION FRAME AND EXTRACTION DEVICE

[75] Inventors: Hoa Pham, San Jose; Gwen Bertolami, Menlo Park, both of Calif.

[73] Assignee: Hewlett Packard Company, Palo Alto, Calif.

[21] Appl. No.: 08/989,937

[22] Filed: Dec. 12, 1997

[51] Int. Cl.$^6$ ................................................ H01R 13/62

[52] U.S. Cl. .......................................... 439/160; 361/686

[58] Field of Search ................................. 439/160, 571; 361/686

[56] References Cited

U.S. PATENT DOCUMENTS 5,162,979  11/1992  Anzelone et al. ...................... 361/686

*Primary Examiner*—Neil Abrams
*Assistant Examiner*—Barry Standig

[57] ABSTRACT

A processor retention frame and incorporated processor extraction handle is described herein. The frame is fabricated from a single piece of sheet metal, holds two processor cards securely, and is easily mounted on the main system board. The extractor handle allows the easy removal of processor cards from the main system board and frame without exerting excessive force on the main system board or the processor board.

14 Claims, 5 Drawing Sheets

PROCESSOR RETENTION FRAME AND EXTRACTION DEVICE

BACKGROUND OF THE INVENTION

The present invention is in the field of mechanical design and fabrication of computer equipment. The invention particularly relates to frames used to hold multiple processor boards in multi-processor systems.

Many computers use two or more central processing units ("CPU"s). Typically, each of the CPUs is mounted on an individual printed circuit board ("PCB"), each of the PCBs being provided with edge connectors. The PCBs with their individual CPUs are then installed in the computer system and held in place by some type of mechanical assembly.

Several new multi-processor systems will use new Intel microprocessors. These new microprocessor will be of the so-called "Slot 1" type. Each of these multi-processor systems has some type of processor retention frame to hold and support the Slot 1 CPUs. One of these processor retention frames is shown in FIG. 1. The illustrated processor retention frame is fabricated from several separate plastic parts which are then assembled together to form the frame. The illustrated frame requires 10 screw holes to attach it to the main system board, limiting the number of locations where the board can be mounted. The frame itself is not attached to the main system board, but rather is attached to the computer chassis, through the main system board. This method of attachment is needed as the frame is too flexible to properly support the microprocessor card. If the combination of the overly flexible frame and the microprocessor card were directly attached to the main system board, the resulting assembly would put a great deal of mechanical stress on the electrical circuitry, leading to frequent premature failures. The known processor retention frame also has no means to easily remove processor boards from the main system board.

SUMMARY OF THE INVENTION

A first embodiment of the present invention comprises a single piece processor retention frame. Several Slot 1 processor units can be easily installed and easily removed from the main system board using an extractor handle that is incorporated into the processor retention frame.

The preferred embodiment of the present invention will now be described in detail with reference to the figures listed and described below.

DETAILED DESCRIPTION OF THE PREFERRED EMBODIMENTS

Figure 1:
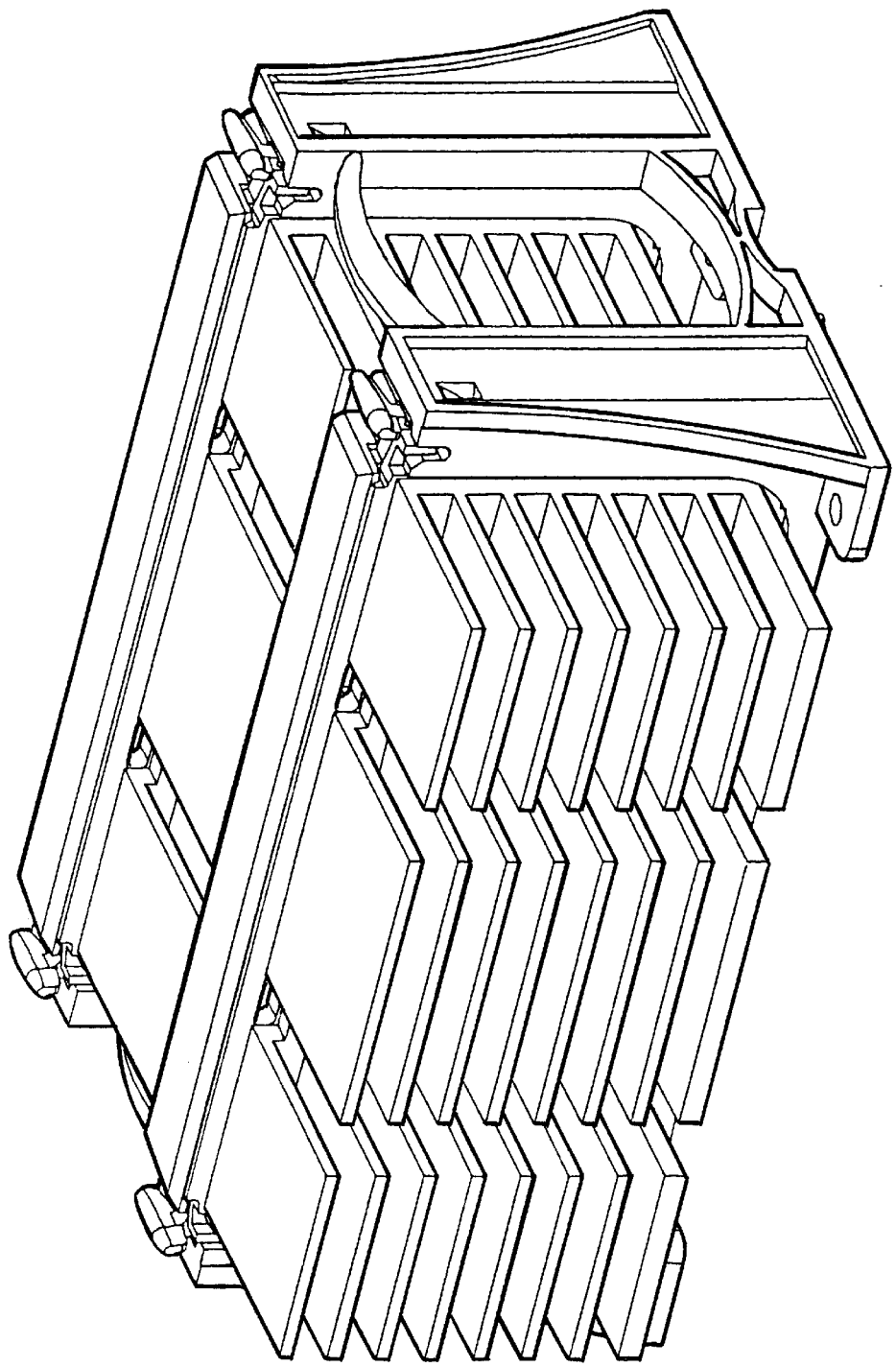
FIG. 1 shows a known processor retention frame (Prior Art)
Figure 2:
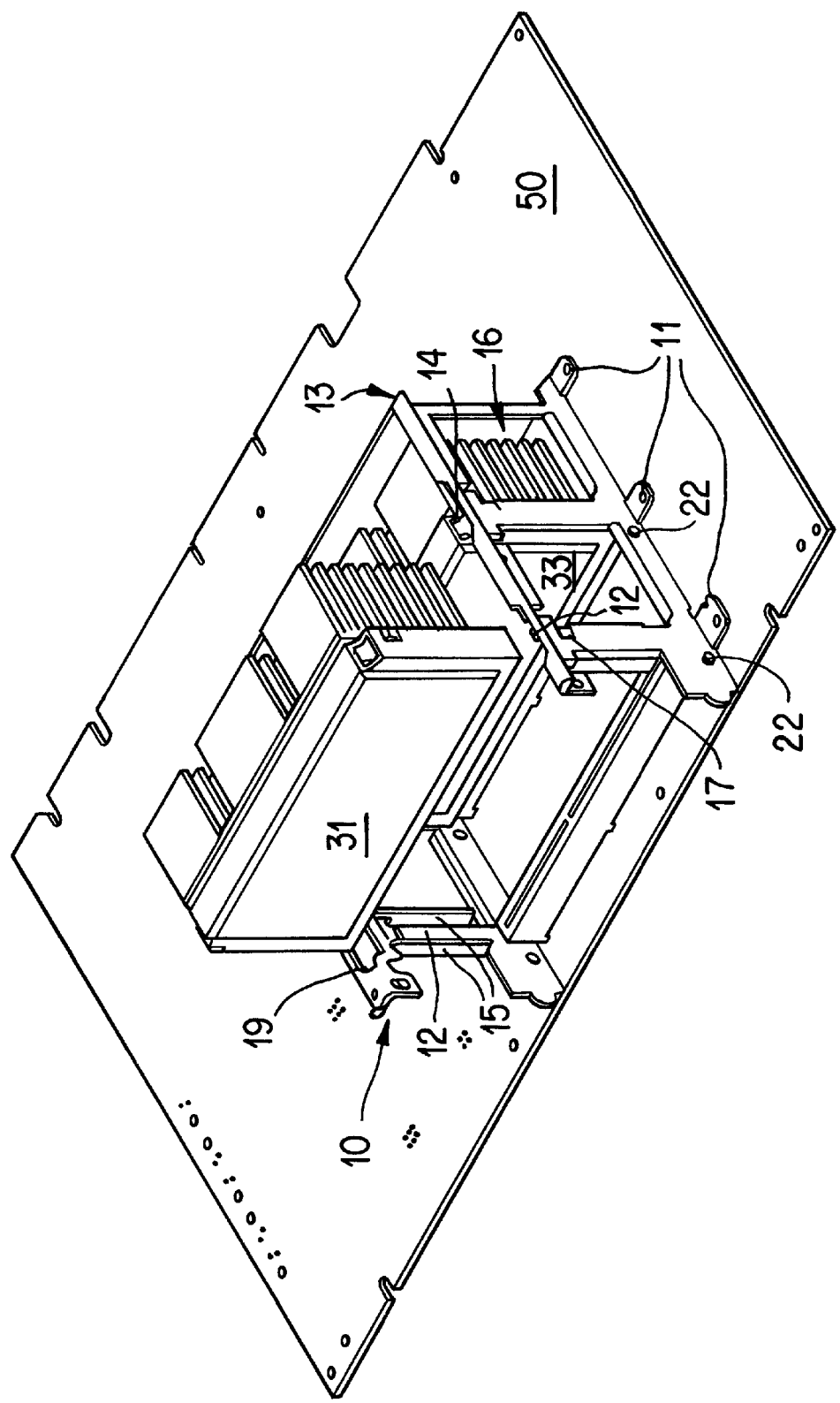
FIG. 2 illustrates the present invention's processor retention frame mounted on a main system board with a first Slot 1 processor installed in the frame and a second Slot 1 processor being installed in the frame.

FIG. 2 shows processor retention frame 10 of the present invention. Processor retention frame 10 is formed from a single piece of sheet metal and is mounted on main system board 50 by means of screws inserted through holes in mounting tabs 11. Processor retention frame 10 can accommodate two Type 1 CPU boards in slots 12 and 14, formed with side flanges 15.

As shown in FIG. 2, two Type 1 CPU boards 31 and 33 can be mounted in one processor retention frame 10, using slots 12 and 14. Each slot is formed with side flanges 15 to insure proper CPU board capture, alignment, and retention. Processor board latch opening 17 captures the CPU board's latch as the CPU board is inserted into processor retention frame 10 and locks the CPU board in the frame. Opening 19 allows access to the CPU board's latch, allowing the user to unlatch and remove CPU boards easily. Openings 16 allow cooling air to flow across the processor boards. Flanges 13 provide additional rigidity to the processor retention frame.

Processor retention frame 10 is stiffer and more robust than the known processor retention frame and requires only a single piece of sheet metal to fabricate it. The box structure of the frame, its use of exterior, as opposed to interior mounting points, and its sheet metal construction all contribute to its robust nature. Frame 10 requires only 6 holes in the main system board to hold the frame, as opposed to 10 holes for the known processor retention frame. Fewer holes simplify conductor routing on the main system board. As frame 10 is more rigid than other known frames, additional support is not needed for the processor boards and the frame can be attached to the main system board and not the computer's chassis.

Figure 3:
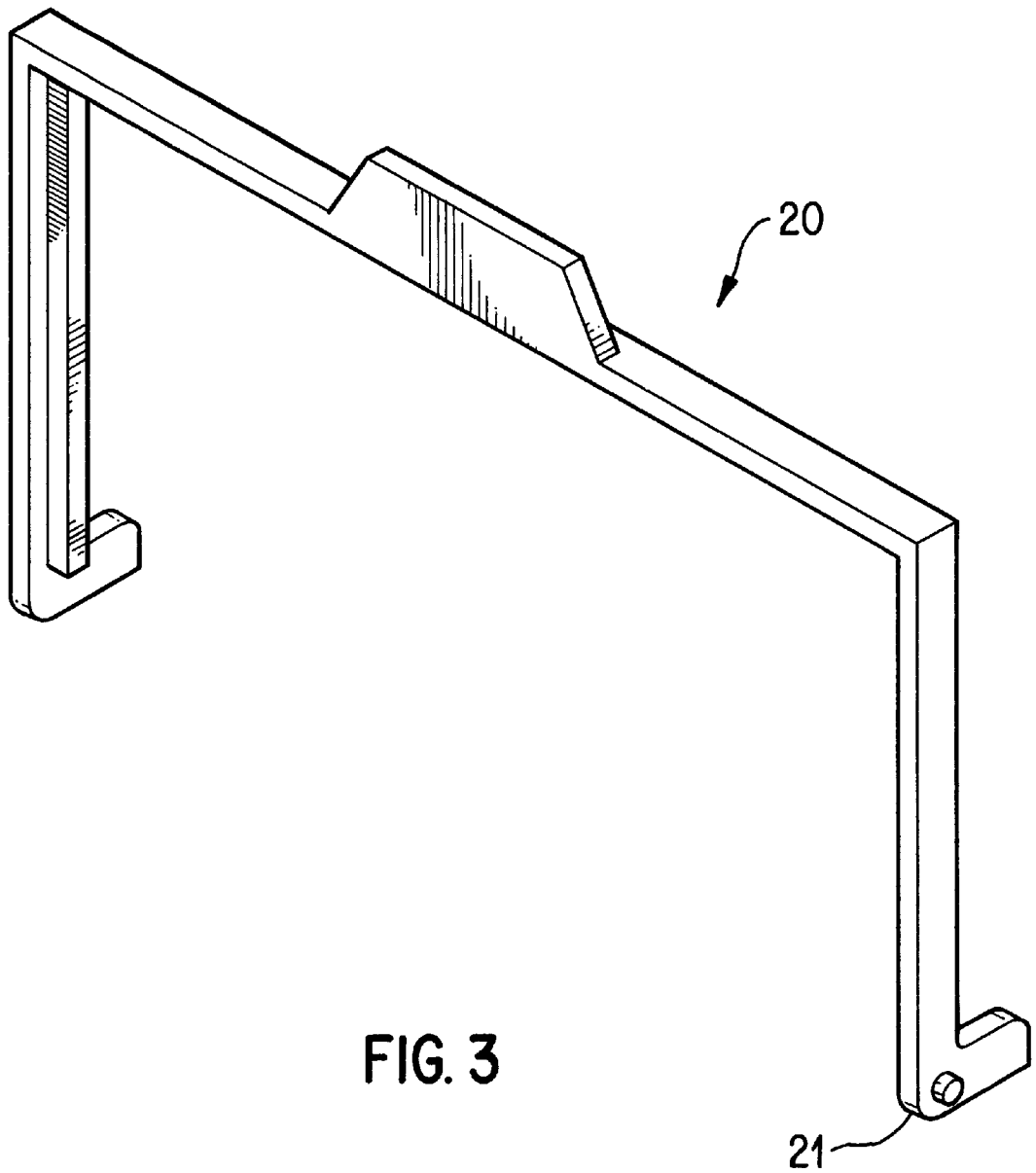
FIG. 3 illustrates the processor extraction handle.
Figure 4:
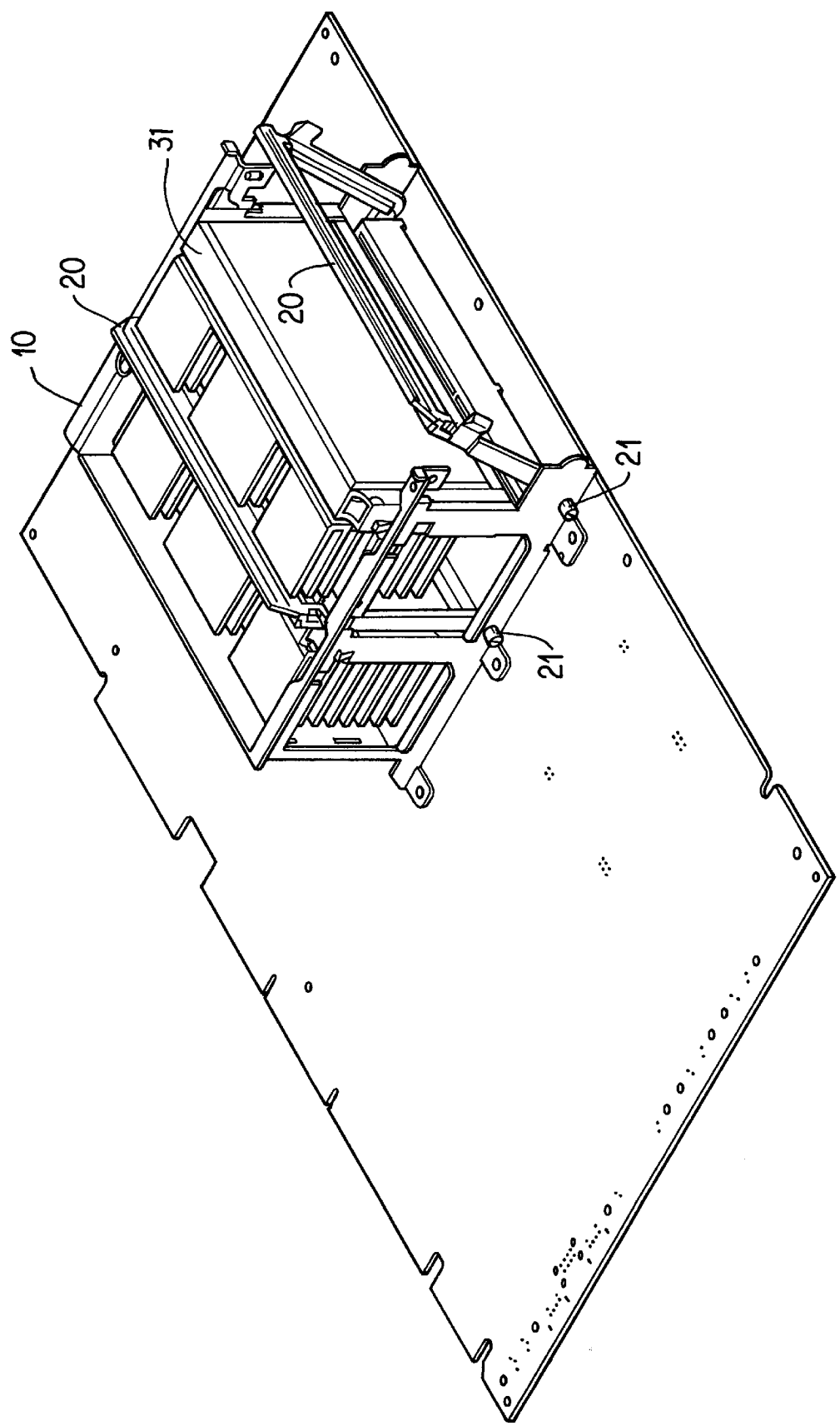
FIG. 4 illustrates the processor extraction handle installed on the processor retention frame shown in FIG. 2.
Figure 5A:
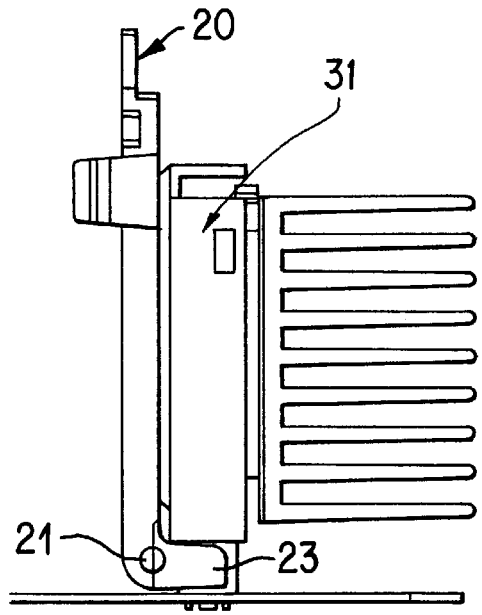
FIGS. 5a and 5b illustrate how the extraction handle appears in a stowed position and in use.
Figure 5B:
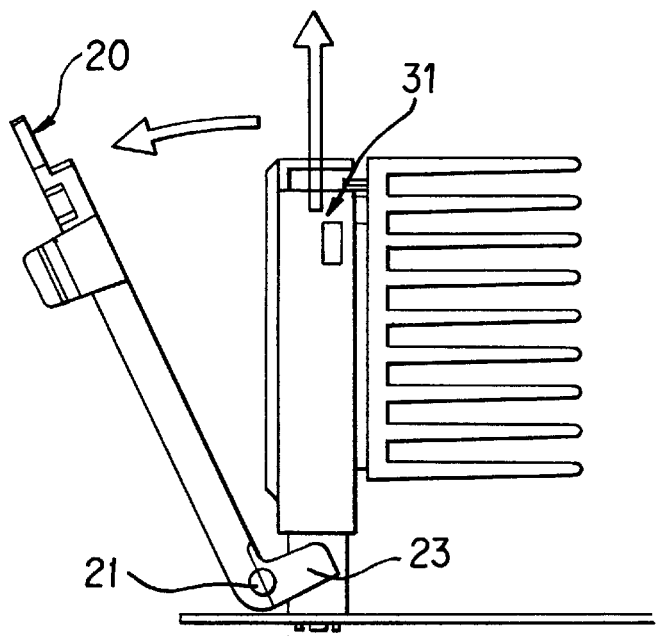

Processor retention frame 10 is provided with two processor extractor handles 20, one for each processor card. Handle 20 is shown separately in FIG. 3. Pivot pins 21 are inserted into holes 22(see FIG. 2) in processor frame 10. The processor retention frame 10 with extractor handle 20 mounted thereon is shown in FIG. 4. As shown in FIG. 5a, when extractor handle 20 is in its stowed, installed position, short arm 23(see also FIG. 3) of handle 20 sits underneath the processor card. As shown in FIG. 5b, in use, short arm 23 applies force to the bottom edge of the processor card, forcing the processor card vertically upwards within either card slot 12 or 14. The processor card requires at least 15 lbs of force to remove it from its connector. Handle 20 gives the user an 8:1 mechanical advantage, allowing less than 2 lbs of force to remove the processor card from its connector. This permits easy, one-handed extraction of the processor cards.

The design of the Slot 1 processor makes it difficult to determine if the processor is latched into frame 10 or not. If the processor is latched and a user tries to remove it from frame 10, a great deal of force will be applied to the processor. This also puts great strain on the main system board and the surrounding components. If the processor is latched and the user tries to remove it with extractor handle 20, the user will get immediate visual feedback that something is wrong, as handle 20 will bow. This also avoids putting any stress on the main system board.

What is claimed is:

1. A processor retention frame with integral processor extraction device comprising:

a processor retention frame, the fabricated frame comprising a first processor retention slot, the first processor retention slot having a processor latch retention fixture and processor latch release access opening, the frame providing a plurality of mounting fixtures to attach the processor retention frame to a main system board; and a first processor extraction device, the first processor extraction device being affixed adjacent to the first processor retention slot, the first processor extraction device pivoting about a pair of pivot points affixed to the frame, the first processor extraction device having a short lever arm that applies extraction force to a first processor in the first processor retention slot, the short lever arm residing at least partially between the first processor and the main system board and thus underneath the first processor when the first processor is located within the processor retention slot.

2. The processor retention frame and integral processor extraction device of claim 1 wherein the processor extraction device provides a visible indication when a user attempts to extract the processor when the processor has not been unlatched from the processor retention frame.

3. The processor retention frame and integral processor extraction device of claim 1 wherein the processor retention frame is fabricated from a single piece of sheet metal.

4. The processor retention frame and integral processor extraction device of claim 1 wherein the processor retention frame provides coolant air access to the first processor retention slot.

5. The processor retention frame and integral processor extraction device of claim 1, wherein the processor retention frame additionally comprises a second processor retention slot, the second processor retention slot having a processor latch retention fixture and processor latch release access opening.

6. The processor retention frame and integral processor extraction device of claim 5, additionally comprising:

a second processor extraction device, the second processor extraction device being affixed adjacent to the second processor retention slot, the processor extraction device pivoting about a pair of pivot points affixed to the frame, the second processor extraction device having a second short lever arm that applies extraction force to a second processor in the second processor retention slot, the second short lever arm residing at least partially between the second processor and the main system board when the second processor is located within the second processor retention slot.

7. A processor retention frame comprising:

a first processor retention slot;

a first airflow channel for processor cooling; and mounting means for mounting the processor retention frame on a printed circuit board;

wherein a first processor extraction handle is mounted on the frame, the handle pivoting about pivot points which permit the handle to pivot, the handle having a pair of short lever arms that apply force to a bottom edge of a processor mounted in the first processor retention slot when tile handle is pivoted, the handle providing a mechanical advantage so that the processor can be removed without applying more than a predetermined amount of force to the printed circuit board; and, wherein the handle flexes visibly when a user attempts to extract a processor from the first processor retention slot without first releasing a processor retention latch.

8. The processor retention frame of claim 7 wherein the handle provides an 8 to 1 mechanical advantage.

9. The processor retention frame of claim 7 wherein the first processor retention slot includes a processor latch retention fixture for capturing and retaining the processor when inserted into the processor retention slot.

10. The processor retention frame of claim 7 wherein the processor retention frame is fabricated from a single piece of sheet metal.

11. A processor retention frame comprising:

a first processor retention slot;

a first airflow channel for processor cooling; and mounting means for mounting the processor retention frame on a printed circuit board;

wherein a first processor extraction handle is mounted on the processor retention frame, the first processor extraction handle pivoting about pivot points which permit the first processor extraction handle to pivot, the first processor extraction handle having a pair of short lever arms that apply force to a bottom edge of a processor mounted in the first processor retention slot when the first processor extraction handle is pivoted, the first processor extraction handle providing a mechanical advantage so that the processor can be removed without applying more than a predetermined amount of force to the printed circuit board.

12. The processor retention frame of claim 11 wherein the first processor extraction handle provides an 8 to 1 mechanical advantage.

13. The processor retention frame of claim 11 wherein the first processor retention slot includes a processor latch retention fixture for capturing and retaining the processor when inserted into the processor retention slot.

14. The processor retention frame of claim 11 wherein the processor retention frame is fabricated from a single piece of sheet metal.

* * * * *